(12) United States Patent
Oshima

(10) Patent No.: US 7,662,488 B2
(45) Date of Patent: Feb. 16, 2010

(54) NITRIDE-BASED SEMICONDUCTOR SUBSTRATE AND METHOD OF MAKING THE SAME

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 213 days.

(21) Appl. No.: 11/357,428

(22) Filed: Feb. 21, 2006

(65) Prior Publication Data

US 2007/0096147 A1    May 3, 2007

(30) Foreign Application Priority Data

Nov. 2, 2005    (JP) .............................. 2005-319630

(51) Int. Cl.
  *B32B 9/00* (2006.01)
  *B32B 19/00* (2006.01)
(52) U.S. Cl. ...................................... 428/698; 117/952
(58) Field of Classification Search ................. 257/189, 257/615; 438/604
  See application file for complete search history.

(56) References Cited

U.S. PATENT DOCUMENTS

| | | | |
|---|---|---|---|
| 5,290,393 A | 3/1994 | Nakamura | |
| 6,413,627 B1 | 7/2002 | Motoki et al. | |
| 6,596,079 B1 * | 7/2003 | Vaudo et al. | 117/97 |
| 6,812,051 B2 * | 11/2004 | Usui et al. | 438/22 |
| 2002/0152951 A1 * | 10/2002 | Tsvetkov et al. | 117/84 |
| 2002/0168844 A1 * | 11/2002 | Kuramoto et al. | 438/604 |
| 2004/0072410 A1 * | 4/2004 | Motoki et al. | 438/481 |
| 2004/0245535 A1 | 12/2004 | D'Evelyn | |
| 2005/0009310 A1 * | 1/2005 | Vaudo et al. | 438/543 |
| 2005/0092234 A1 * | 5/2005 | Motoki et al. | 117/91 |

FOREIGN PATENT DOCUMENTS

| | | |
|---|---|---|
| JP | 04-297023 | 10/1992 |
| JP | 2000-012900 | 1/2000 |
| JP | 2005-213075 | 8/2005 |
| WO | 2004/061923 A1 | 7/2004 |

OTHER PUBLICATIONS

Oshima et al. "Preparation of Free standing GaN wafers by HVPE with Void assisted separation" Jpn. J. Appl. Phys. vol. 42 (2003) pp. (L1-L3). Part 2. Express letters.*
Oshima et al. "Thermal and optical properties of Bulk GaN crystals fabricated through HVPE with Void Assisted Separation". Journal of Applied Physics. vol. 98. Issue 10. Article 103509. (2005).*
Motoki et al., "Growth and characterization of freestanding GaN substrates", Journal of Crystal Growth 237-239 (2002) pp. 912-921.*
Chinese Office Action dated Dec. 21, 2007, with English-language translation.
Chinese Office Action dated May 30, 2008 with English translation.
Japanese Office Action dated Nov. 17, 2009 with English translation.

* cited by examiner

*Primary Examiner*—Timothy M Speer
*Assistant Examiner*—Jonathan C Langman
(74) *Attorney, Agent, or Firm*—McGinn IP Law Group PLLC

(57) ABSTRACT

A nitride-based semiconductor substrate having a diameter of 25 mm or more, a thickness of 250 micrometers or more, and an optical absorption coefficient of less than 7 cm$^{-1}$ to light with a wavelength of 380 nm or more. The nitride-based semiconductor substrate is made by the HVPE method that uses gallium chloride obtained by reacting a Ga melt with a hydrogen chloride gas. The Ga melt is contacted with the hydrogen chloride gas for one minute or more to produce the gallium chloride.

8 Claims, 6 Drawing Sheets

NITRIDE-BASED SEMICONDUCTOR SUBSTRATE AND METHOD OF MAKING THE SAME

The present application is based on Japanese patent application No. 2005-319630 filed Nov. 2, 2005, the entire contents of which are incorporated herein by reference.

BACKGROUND OF THE INVENTION

1. Field of the Invention

This invention relates to a nitride-based semiconductor substrate and, in particular, to a nitride-based semiconductor substrate that satisfies a high transparency and a high conductivity together. Also, this invention relates to a method of making the nitride-based semiconductor substrate.

2. Description of the Related Art

GaN-based compound semiconductors such as gallium nitride (GaN), indium gallium nitride (InGaN) and aluminum gallium nitride (AlGaN) attract attention for a material of blue light emitting diode (LED) or laser diode (LD). Further, since the GaN-based compound semiconductors have a good heat resistance and environment resistance, they have begun to be applied to other electronic devices.

Thus far, the GaN-based compound semiconductors have been grown by using a sapphire single crystal substrate.

However, since the sapphire substrate mismatches in lattice constant with the GaN, a GaN single crystal film cannot be grown directly on the sapphire substrate. Therefore, a method is developed in which a buffer layer (=low-temperature growth buffer layer) of AlN or GaN is grown on the sapphire substrate at a low temperature to buffer a strain in lattice, and then GaN is grown thereon (e.g., JP-A-H04-297023).

By using the low-temperature growth buffer layer, the epitaxial growth of GaN single crystal can be realized. However, the above method still has a problem that the grown GaN has a number of defects since the lattice mismatch between the substrate and the GaN crystal is not perfectly eliminated. It is presumed that the defect may bring some failure to the manufacture of a GaN-based LD and high-brightness LED.

Because of this, a GaN self-standing substrate not to cause the mismatch between the substrate and the GaN crystal is desired to develop. Since it is difficult to grow a large ingot of GaN from a melt by using the pulling method applied to Si or GaAs, various methods such as the HVPE (hydride vapor phase epitaxy), the ultrahigh temperature and pressure method and the flux method and have been tried to make the GaN self-standing substrate.

Especially, the development of the GaN self-standing substrate by HVPE is most advanced. The GaN self-standing substrates by HVPE have gradually begun to be commercially available. Thus, it is much expected to be used for LD and high-brightness LED.

A method for making the GaN self-standing substrate by HVPE is conducted such that a mask with dot-like or stripe windows is formed on a GaAs substrate, growing a GaN buffer layer thereon, epitaxially thereon growing a GaN single crystal layer by HVPE, finally removing the GaAs substrate (e.g., JP-A-2000-12900 and JP-A-2005-213075).

When the GaN self-standing substrate is applied to a light emitting device such as an LED, light emitted from an active layer of LED can be propagated through the GaN self-standing substrate before being radiated externally. Therefore, the GaN self-standing substrate needs to have a high transparency to provide a high efficiency LED.

However, since it is difficult to sufficiently reduce the lattice defect or impurity concentration in nitride-based semiconductors, a nitride-based semiconductor substrate with a sufficient transparency has not been obtained. For example, when a GaN substrate is grown by the conventional HVPE, $GaCl_3$ and $NH_4Cl$, intermediate products in the growth process, with a high moisture absorption property cause the incorporation of oxygen etc. so that the transparency lowers. Further, doping conducted to secure a sufficient conductivity may cause a reduction in the transparency. Thus, it is difficult to satisfy the high transparency and high conductivity together in the nitride-based semiconductor substrate.

The GaN self-standing substrate disclosed in JP-A-2000-12900 and JP-A-2005-213075 fails to have a sufficiently low optical absorption coefficient. Thus, a GaN self-standing substrate with the sufficiently low optical absorption coefficient to provide a high transparency is desired to develop.

SUMMARY OF THE INVENTION

It is an object of the invention to provide a nitride-based semiconductor substrate that satisfies a high transparency and a high conductivity together.

It is a further object of the invention to provide the nitride-based semiconductor substrate.

(1) According to one aspect of the invention, a nitride-based semiconductor substrate comprises:

a diameter of 25 mm or more;

a thickness of 250 micrometers or more; and an optical absorption coefficient of less than $7\ cm^{-1}$ to light with a wavelength of 380 nm or more.

In the above invention, the following modifications and changes can be made.

(i) The nitride-based semiconductor substrate further comprises an electrical resistivity of 0.02 ohm·cm or less.

(ii) The nitride-based semiconductor substrate further comprises a dislocation density of $1\times 10^7\ cm^{-2}$ or less.

(iii) The nitride-based semiconductor substrate further comprises an impurity concentration of $1\times 10^{17}\ cm^{-3}$ or less in relation to any of As, O, Cl, P, Na, K, Li, Ca, Sn, Ti, Fe, Cr and Ni.

(2) According to another aspect of the invention, a method of making a nitride-based semiconductor substrate comprises:

making the nitride-based semiconductor substrate by the HVPE method that uses gallium chloride obtained by reacting a Ga melt with a hydrogen chloride gas, wherein the Ga melt is contacted with the hydrogen chloride gas for one minute or more to produce the gallium chloride.

(3) According to another aspect of the invention, a method of making a nitride-based semiconductor substrate comprises:

forming a thin film on a surface of an underlying substrate, the thin film comprising a plurality of microscopic pores and a metal or a compound comprising the metal; and growing thereon epitaxially a nitride-based semiconductor in an atmosphere with a hydrogen partial pressure of 5 kPa or more by the HVPE method.

(4) According to another aspect of the invention, a method of making a nitride-based semiconductor substrate comprises:

growing a nitride-based semiconductor layer such that the nitride-based semiconductor layer has a first thickness on an initial stage that the nitride-based semiconductor layer is grown forming a facet except a c-plane, wherein the first thickness is 30% or less relative to an entire thickness of the nitride-based semiconductor layer to be finally formed.

(5) According to another aspect of the invention, a method of making a nitride-based semiconductor substrate comprises the steps of:

forming a Ti film on a sapphire substrate with a GaN film formed thereon, and then heating the Ti film in an atmosphere comprising a mixture of a hydrogen gas and an ammonia gas to change the Ti film into a TiN film with microscopic pores;

growing a GaN layer on the TiN film by the HVPE method to react gallium chloride with ammonia while using a carrier gas comprising a hydrogen gas with a partial pressure of 5 kPa or more, the gallium chloride being produced by contacting a Ga melt with a hydrogen chloride gas for one minute or more, wherein the GaN layer is grown such that the GaN layer has a first thickness on an initial stage that the GaN layer is grown forming a facet except a c-plane, and the first thickness is 30% or less relative to an entire thickness of the GaN layer to be finally formed; and separating the grown GaN layer from the sapphire substrate.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
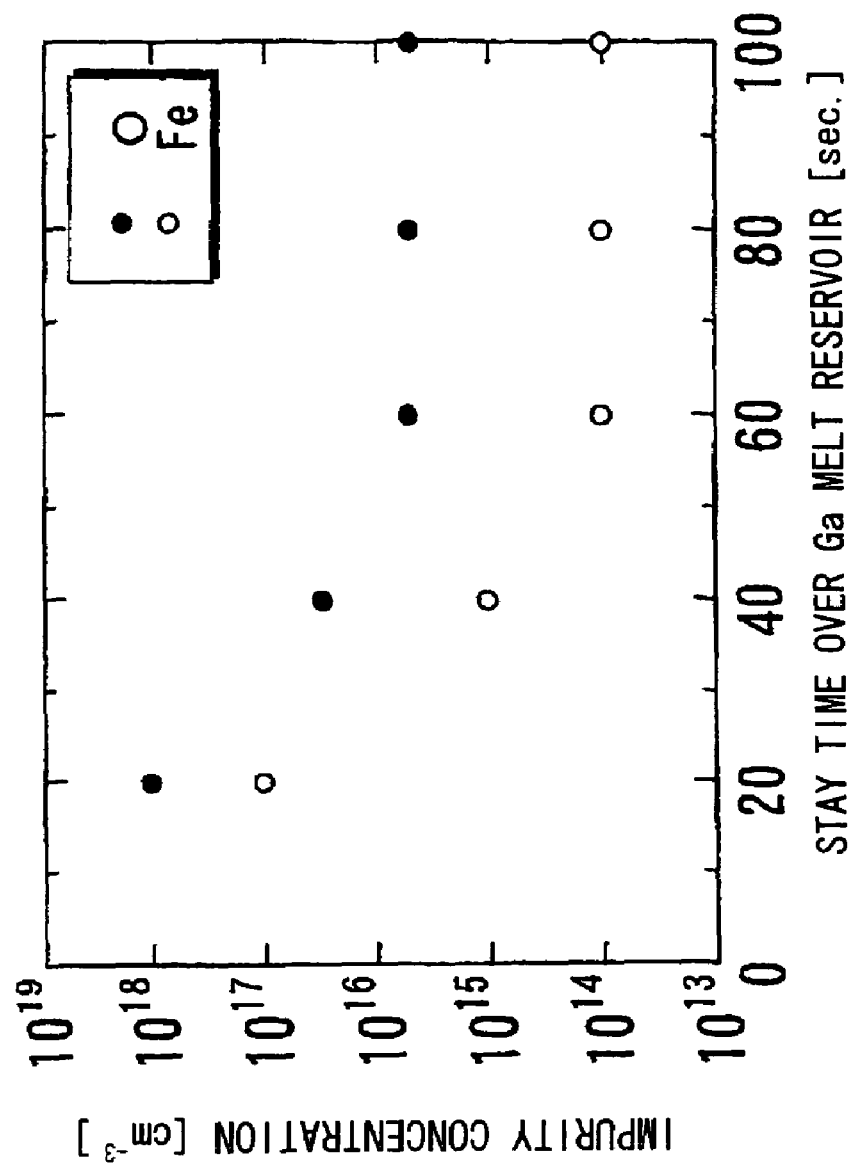
FIG. 1 is a graph showing a relationship between a stay time over Ga melt of HCl gas and carrier gas and an impurity concentration in grown crystal.

A GaN self-standing substrate and a method of making the same in preferred embodiments of the invention will be detailed below.

Size of Substrate

The GaN self-standing substrate of the embodiment has a diameter of 25 mm or more and a thickness of 250 μm or more. If less than 25 mm in diameter, the productivity of the substrate lowers. If less than 250 μm in thickness, the mechanical strength of the substrate lowers and, therefore, the substrate may be hard to handle.

Optical Absorption Coefficient

The GaN self-standing substrate of the embodiment has an optical absorption coefficient of less than 7 $cm^{-1}$ to light with a wavelength of 380 nm or more. In general, in order to secure the conductivity of a substrate, the carrier concentration needs to be increased by doping an impurity such as Si and Ge. However, the transparency must lower by the doping of the impurity. In contrast, the GaN self-standing substrate of the embodiment succeeds in significantly reducing the level of an impurity by using a method described later, e.g., As, O, Cl, P, Na, K, Li, Ca, Sn, Ti, Fe, Cr and Ni can be all $1 \times 10^{17}$ $cm^{-3}$ or less in concentration. Thus, even when the doping is conducted such that a sufficient conductivity can be obtained, the optical absorption coefficient can be less than 7 $cm^{-1}$. Therefore, the transparency can be still kept at a high level. Further, the optical absorption coefficient can be brought to a minimum value of 0.05 $cm^{-1}$ by minimizing the doping amount, e.g., $1 \times 10^{18}$ $cm^{-2}$, to secure the sufficient conductivity.

Electrical Resistivity and Carrier Concentration

The GaN self-standing substrate of the embodiment has preferably an electrical resistivity of 0.02 ohm·cm to secure the sufficient conductivity. When the doping amount is increased too much to reduce the electrical resistivity (or to increase the conductivity, the optical absorption coefficient must increase or the crystalline quality must deteriorate. Therefore, the doping amount is preferably controlled so as to have a lower limit of 0.001 ohm·cm in electrical resistivity.

Further, the GaN self-standing substrate of the embodiment has preferably a carrier concentration of $1 \times 10^{17}$ $cm^{-3}$ to $1 \times 10^{19}$ $cm^{-3}$. If less than $1 \times 10^{17}$ $cm^{-3}$ in carrier concentration, the GaN self-standing substrate must have an electrical resistivity of more than 0.02 ohm·cm, so that it fails to secure the sufficient conductivity. If more than $1 \times 10^{19}$ $cm^{-3}$ in carrier concentration, the optical absorption coefficient must increase.

The doped impurity (=dopant) can be Si, Ge, O, C etc. and a combination thereof.

Method for Reducing the Impurity Concentration

It is important to reduce the impurity concentration in order to obtain the abovementioned GaN self-standing substrate with the high transparency. In general, in order to reduce the impurity concentration, it is needed to increase the purity of a raw material, carrier gas and a member used in the growth, or to install a glove box or to conduct a sufficient purge before the growth, or to make a complete control of furnace impurity level such as pre-baking.

However, a residual impurity incorporated in the grown crystal causes a reduction in the transparency.

The inventor considers how to further reduce the impurity level to enhance the transparency (i.e., to reduce the optical absorption coefficient). As a result, the inventor finds the following three effective methods (a) to (c).

(a) To Contact Source Gas or Carrier Gas with Ga Melt for a Long Time Period in the HVPE Method To increase the purity of the raw material is fundamental to enhancement of the purity of crystal. In the HVPE method, GaCl as a group III source is generated by flowing or bubbling HCl gas and carrier gas over or in the Ga melt disposed in the furnace to react them each other. The HCl gas has a very strong corrosive property and contains many kinds of impurities, e.g., metal elements. The Ga melt has a high impurity trapping effect. The inventor investigated the relationship between a time period to allow HCl gas to stay over (or contacted with) the Ga melt and a resultant impurity concentration in the grown crystal. As a result, it is found that the purity of the grown crystal can be significantly enhanced by setting the stay time period to be longer than a conventional time period.

FIG. 1 is a graph showing a relationship between the time period to allow HCl gas and carrier gas to stay over the Ga melt and the concentration of impurity trapped in grown crystal.

As a result, it is understood that, by setting the stay time over the Ga melt to be about 1 min. (=60 sec.) or more, the oxygen (O) impurity concentration can be significantly reduced to about $10^{16}$ cm$^{-3}$ from about $10^{18}$ cm$^{-3}$ and the iron (Fe) impurity concentration can be significantly reduced to about $10^{14}$ cm$^{-3}$ from about $10^{17}$ cm$^{-3}$. In general, the HCl gas is supplied into the reactor together with the carrier gas. Therefore, it is assumed that the carrier gas can be purified as well as the HCl gas by being contacted with the Ga melt with the high impurity trapping effect for 1 min. or more. However, it is impossible to purify $NH_3$ as a group V source as well since the $NH_3$ reacts strongly with Ga.

Although the stay time needed over the Ga melt may vary depend on other factors such as a shape of reservoir, the same tendency as shown in FIG. 1 can be obtained even when the other factors vary. Thus, the stay time is to be about 1 min. or more.

(b) To Form a Thin Film with Microscopic Pores to Have the Impurity Trapping Effect on an Underlying Substrate The inventor finds that the thin film with a number of microscopic pores made of a metal or metal compound is effective in preventing an impurity left even after conducting the above process (a).

For example, after a nitride-based semiconductor layer is grown on a sapphire substrate as the underlying substrate by MOVPE etc., a metal film made of titanium, nickel, tantalum, tungsten etc. is formed on the nitride-based semiconductor layer. Then, by conducting a heat treatment in an atmosphere containing hydrogen and ammonia, the metal is nitrided and aggregated to provide a structure (herein called nanomask) with a number of microscopic pores. The nanomask allows the relaxation of strain caused by lattice mismatch or a difference in thermal expansion coefficient between the sapphire substrate and the nitride-based semiconductor layer so as to reduce the defect density (e.g., up to a dislocation density of $1\times10^7$ cm$^{-2}$ or less). Especially when the metal film of titanium is formed thereon and nitrided in surface, the titanium nitride also serves as a buffer layer for the nitride-based semiconductor layer which is grown on the metal film. Therefore, the grown nitride-based semiconductor layer can have a good crystalline quality.

The metal film can be grown by the vapor deposition method, sputtering, various CVD methods etc. The microscopic pores are desirably dispersed uniformly on the surface of the metal film so as to reduce the defect density (e.g., up to a dislocation density of $1\times10^7$ cm$^{-2}$ or less) in the nitride-based semiconductor layer to be grown thereon. The production of the microscopic pores can be controlled by the thickness of the metal film, the thickness of the nitride-based semiconductor layer on the sapphire substrate, and the conditions of the heat treatment. For example, in order to allow the nitriding of the metal film and 100 nm or less of uniform microscopic pores, the heat treatment is desirably conducted at 700 degree Celsius or more and 1400 degree Celsius or less. If less than 700 degree Celsius, the nitriding is not sufficiently advanced and the uniform pores can be generated. If more than 1400 degree Celsius, the heat decomposition of the nitride-based semiconductor may be excessively advanced so that the nitride film is subjected to separation. The thickness of the metal film is desirably 1 micrometer or less. If more than 1 micrometer, the surface of the metal film may be formed uneven when the metal film is nitrided. This may cause an increase in defect in the nitride-based semiconductor layer to be grown thereon.

The heat treatment can be in a hydrogen gas atmosphere or a mixed gas atmosphere containing hydrogen. The mixed gas atmosphere containing hydrogen is, for example, a mixed gas atmosphere of 80 to 60% of hydrogen gas and 20 to 40% of ammonia.

Figure 2:
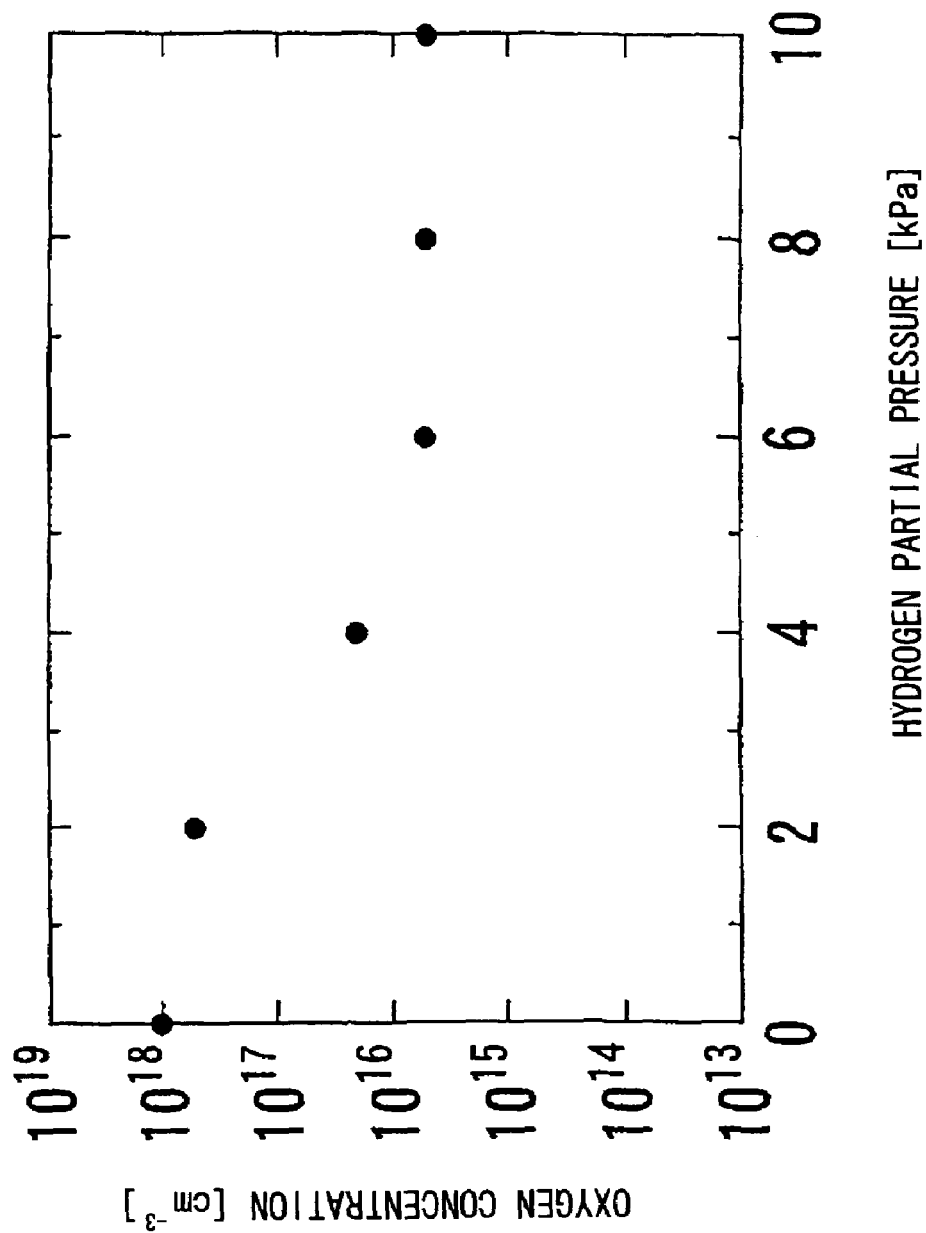
FIG. 2 is a graph showing a relationship between a hydrogen partial pressure in growing by HVPE a nitride-based semiconductor on an underlying substrate with a nano-mask formed thereon and an oxygen impurity concentration in the grown crystal.

FIG. 2 is a graph showing a relationship between a hydrogen partial pressure in growing by HVPE a nitride-based semiconductor on an underlying substrate with a nanomask formed thereon and an oxygen impurity concentration in the grown crystal.

As a result, it is understood that, by setting the hydrogen partial pressure to be 5 kPa or more, the oxygen (O) impurity concentration can be significantly reduced to about $10^{16}$ cm$^{-3}$ from about $10^{18}$ cm$^{-3}$. This is assumed because the porous surface of the thin film is activated by hydrogen and, therefore, the impurity to impair the transparency of the crystal is likely to be trapped thereby. However, this effect can be obtained only before the surface of the substrate is covered with the grown crystal. Namely, after the porous thin film is completely covered with the grown crystal, the effect will be eliminated.

(c) To Shorten the Growth Period with a Facet (i.e., a Flat Crystal Plane) to be Likely to Trap the Impurity Other than C-plane The growth of GaN is, in most cases, advanced on its initial stage according to a growth mode called Volmer-Waber type that a number of three-dimensional nuclei are generated and gradually combined each other to form a continuous film. During the growth, facets such as (1-102) are generated on the side of a growth nucleus and are left as a pit for a while even after the growth nuclei are combined each other.

The inventor finds that, in case of growing the crystal with the facets, the impurity, especially oxygen is likely to be trapped thereby as compared to the case of growing the crystal with the flat c-plane (i.e., substantially without the facet other than the c-plane). The oxygen thus trapped may be dispersed in the crystal to impair the transparency even after the growth surface is flattened. Thus, it is important to make a transition to the flat growth as soon as possible.

Figure 3:
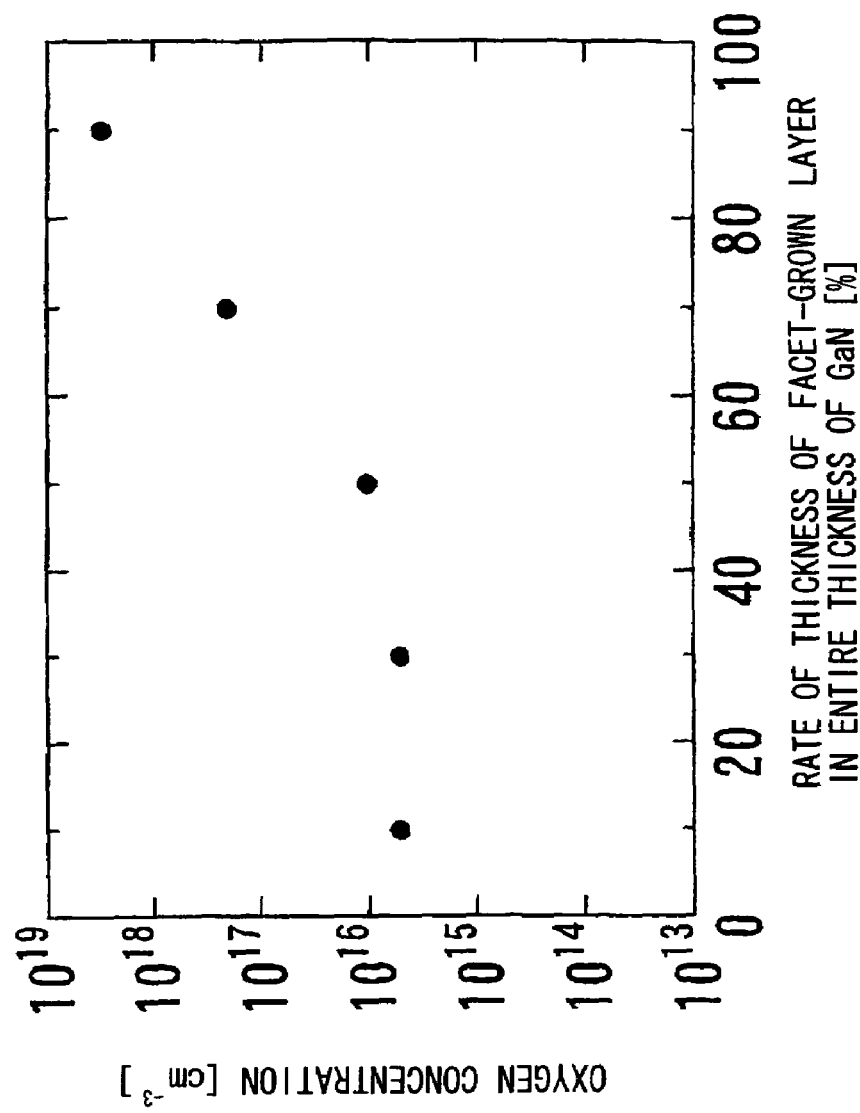
FIG. 3 is a graph showing a relationship between a rate of the thickness of a facet-grown layer in the entire thickness of a GaN layer and an oxygen concentration in the grown crystal.

FIG. 3 is a graph showing a relationship between a rate of the thickness of a facet-grown layer in the entire thickness of a GaN layer and an oxygen concentration in the grown crystal.

As a result, it is understood that the oxygen impurity concentration can be effectively reduced to a low range of $10^{16}$ cm$^{-3}$ or less by controlling the thickness of the facet-grown layer in the entire thickness to be about 30% or less.

The method (c) is effective in reducing the impurity after the surface of the substrate is completely covered with the grown crystal.

The methods (a) to (c) may be conducted individually or in a combination of any thereof.

As described above, in the growth of GaN, by using any one or all of:

(a) the impurity trapping effect by the Ga melt;

(b) the impurity trapping effect by the porous film; and (c) the early transition to growing with the plane less likely to trap the impurity, a nitride-based semiconductor substrate can be fabricated with:

(1) a high transparency that its optical absorption coefficient to light with a wavelength of 380 nm or more is less than 7 cm$^{-1}$;

(2) a sufficiently low conductivity that its electrical resistivity is 0.02 ohm·cm or less;

(3) a high crystalline quality that the dislocation density of the substrate is $1 \times 10^7$ cm$^{-2}$ or less;

(4) a low impurity concentration that the concentration of As, O, Cl, P, Na, K, Li, Ca, Sn, Ti, Fe, Cr and Ni is all $1 \times 10^{17}$ cm$^{-3}$ or less.

Example 1

An Example to Use the Method (a)

Figure 4:
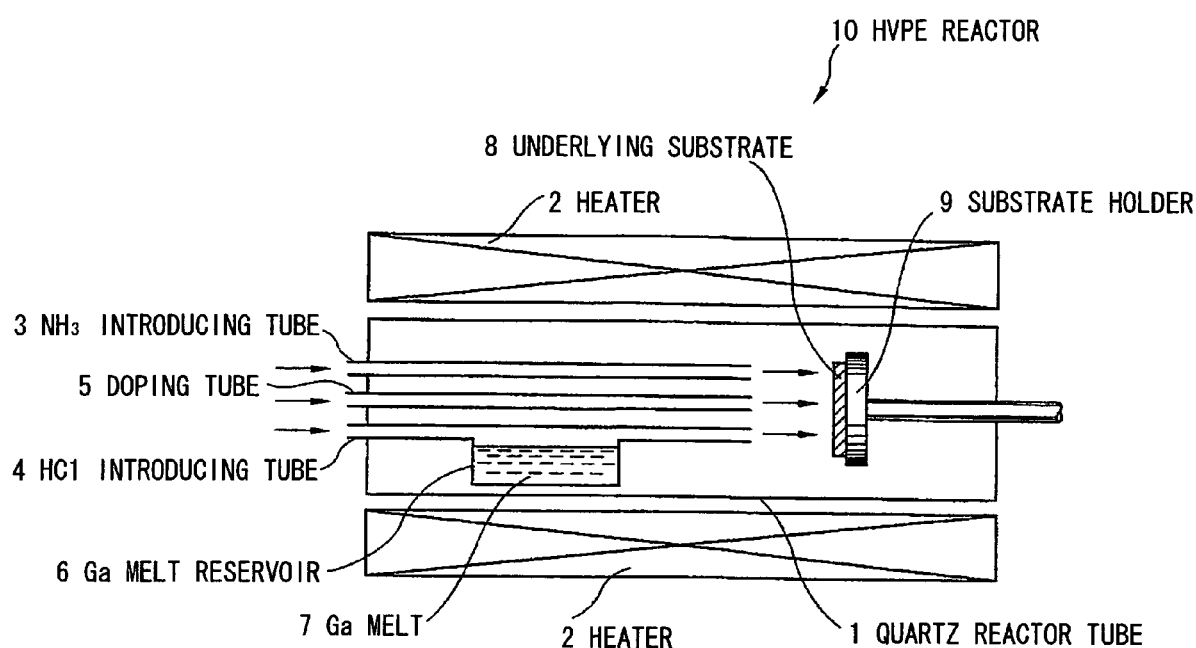
FIG. 4 is a schematic diagram illustrating an HVPE reactor used in Example 1 according to the invention.

FIG. 4 is a schematic diagram illustrating an HVPE reactor used in Example 1 according to the invention.

The HVPE reactor 10, which is a hot-wall type with a heater 2 outside a horizontally long quartz reactor tube 1, comprises, on the left side (i.e., upstream side) of the quartz reactor tube 1, an NH$_3$ introducing tube 3 to introduce NH$_3$ gas, a group V source, an HCl introducing tube 4 to introduce HCl gas for forming GaCl, a group III source, and a doping tube 5 to introduce doping gas for controlling the conductivity.

The HCl introducing tube 4 is halfway enlarged in its inside diameter to provide a Ga melt reservoir 6 to contain a Ga melt 7.

A substrate holder 9 with an underlying substrate 8 placed thereon is rotatably and movably disposed on the right side (i.e., downstream side) of the quartz reactor tube 1.

In growing GaN by using the HVPE reactor 10, the NH$_3$ gas as the group V source is introduced through the NH$_3$ introducing tube 3, the HCl gas to form the group III source through the HCl introducing tube 4, and a dopant element-containing gas through the doping tube 5. Meanwhile, the source gas, HCl gas and NH$_3$ gas are introduced mixed with a carrier gas such as H$_2$ gas to control the reactivity.

In the HCl introducing tube 4, the HCl gas is halfway contacted with the Ga melt 7 and thereby a reaction: Ga+HCl→GaCl+(½)H$_2$ is developed to produce gallium chloride, GaCl.

In this process, the stay time of the HCl gas over the Ga melt 7 is adjusted to be 1 min. or more by controlling the flow rate of H2 carrier gas based on a calculation in view of a volume of the Ga melt reservoir 6. Thereby, the HCl gas and carrier gas can be purified.

The mixed gas of purified GaCl gas and H$_2$ carrier gas, and the mixed gas of NH$_3$ and H$_2$ carrier gas are conveyed to a direction as shown by arrows in FIG. 4 in the space of the quartz reactor tube 1. Then, a reaction: GaCl+NH$_3$→GaN+HCl+H$_2$ is developed on the underlying substrate 8 placed on the substrate holder 9 to deposit GaN on the underlying substrate 8. In the HVPE method, the GaN single crystal is epitaxially grown at an atmosphere temperature of about 800 to 1050 degree Celsius. Waste gas is removed through a waste gas outlet (not shown).

The GaN single crystal thus grown can have a low impurity concentration since it is produced using the HCl source gas and H$_2$ carrier gas to be purified by being contacted with the Ga melt with the high impurity trapping effect for 1 min. or more.

Example 2

An Example to Use the Methods (a)+(b)+(c)

FIGS. 5A to 5G are cross sectional views showing a method of making a GaN self-standing substrate in Example 2 according to the invention.

A GaN self-standing substrate is made by a process as shown in FIGS. 5A to 5G.

Figure 5A:
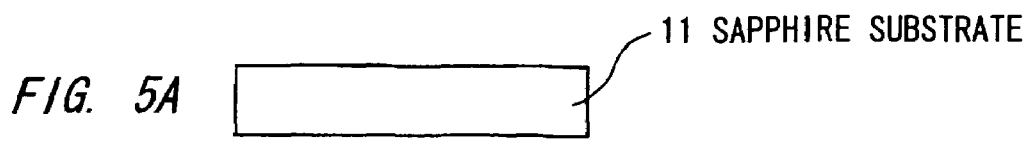
FIGS. 5A to 5G are cross sectional views showing a method of making a GaN self-standing substrate in Example 2 according to the invention.
Figure 5B:
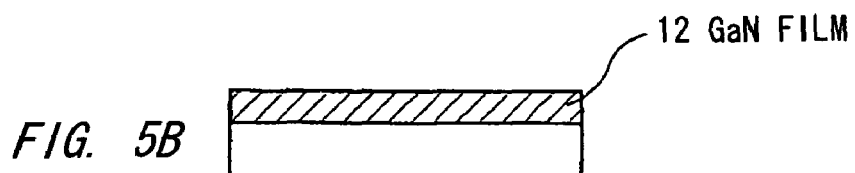
Figure 5C:
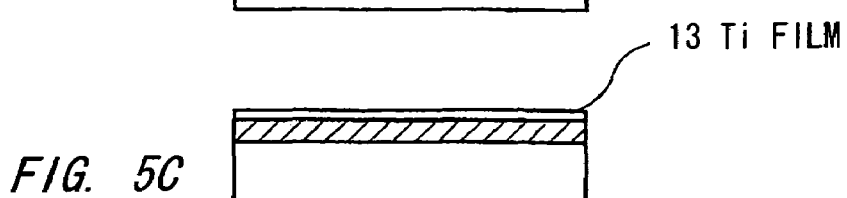
Figure 5D:
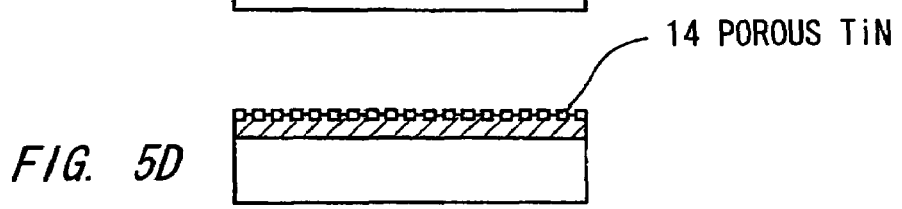
Figure 5E:
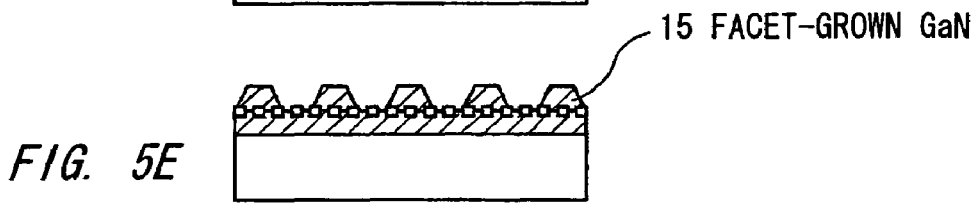

First, a sapphire substrate 11 with a diameter of 2 inches is provided as an underlying substrate (FIG. 5A). Then, a GaN film 12 is formed 300 nm thick on the sapphire substrate 11 by MOVPE (FIG. 5B). Then, a Ti film 13 is vacuum-deposited 20 nm thick (FIG. 5C) thereon, and then heated at 1000 degree Celsius for 30 min. in a mixed atmosphere of H$_2$ and NH$_3$ (with H$_2$ gas partial pressure of 80 kPa). By the heat treatment, the Ti film 13 on the surface of the substrate is nitrided such that it is changed into a porous TiN 14 with a number of microscopic pores with an inside diameter of tens of micrometers by the aggregation effect (FIG. 5D).

Then, it is placed in the HVPE reactor 10 as shown in FIG. 4 and a GaN thick film 17 is grown 500 micrometers thick therein. In this process, the stay time of the HCl gas is adjusted to be 90 sec. by controlling the flow rate of H$_2$ carrier gas based on a calculation in view of the volume of the Ga melt reservoir 6. The H$_2$ partial pressure is 10 kPa, the GaCl partial pressure 2 kPa, and the NH$_3$ partial pressure 20 kPa. SiH$_2$Cl$_2$ is introduced through the doping tube 5 to adjust the final Si concentration to $5 \times 10^{18}$ cm$^{-3}$ to secure a sufficient conductivity.

In the crystal growth process, a facet-grown GaN 15 is grown on the initial stage (FIG. 5E) and then is combined each other to form a continuous film. As the result of observing the section of a crystal grown under the same conditions by a fluorescence microscope, the facet-grown GaN 15 has a thickness of about 75 micrometers. Thus, the rate of the thickness of the facet-grown GaN 15 in the entire thickness of the GaN layer is about 15%.

Figure 5F:
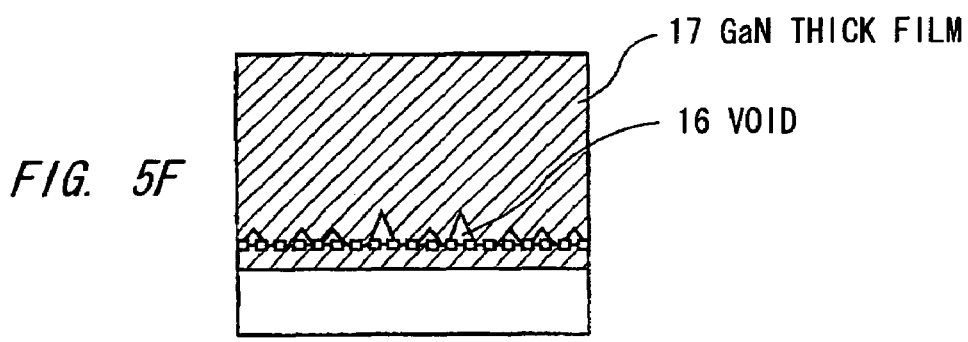
Figure 5G:
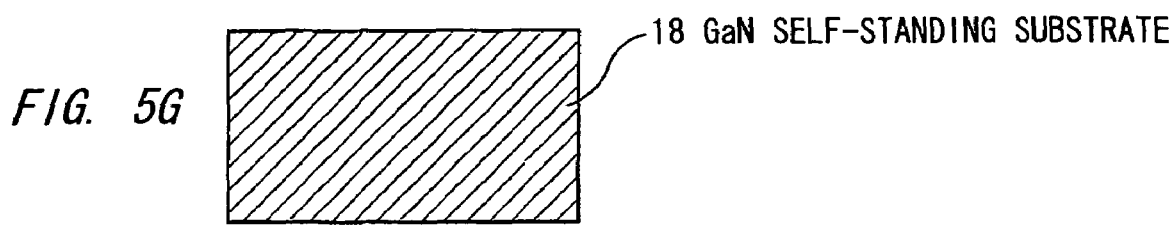

A number of voids are formed on the interface of the porous film in the process of the HVPE growth (FIG. 5F). Therefore, the GaN thick film 17 is by itself separated from the sapphire substrate 11 after the growth, whereby the GaN self-standing substrate 18 with a diameter of 2 inches is obtained (FIG. 5G).

The dislocation density of the obtained GaN self-standing substrate measured by the cathode luminescence method is a relatively good value, $3 \times 10^6$ cm$^{-2}$. The electrical resistivity thereof is a sufficiently low value, $4 \times 10^{-3}$ ohm·cm. O and Fe are not detected by SIMS analysis. The optical absorption coefficient to light with a wavelength of 380 nm or more measured by transmission and reflection measurements is 4 cm$^{-2}$, which reveals a very high transparency.

Comparative Example

FIGS. 6A to 6F are cross sectional views showing a method of making a GaN self-standing substrate in Comparative Example.

A GaN self-standing substrate is made by a process as shown in FIGS. 6A to 6F.

Figure 6A:
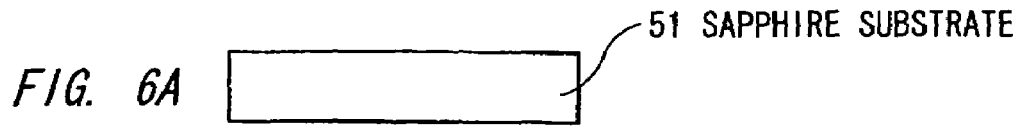
FIGS. 6A to 6F are cross sectional views showing a method of making a GaN self-standing substrate in Comparative Example.
Figure 6B:
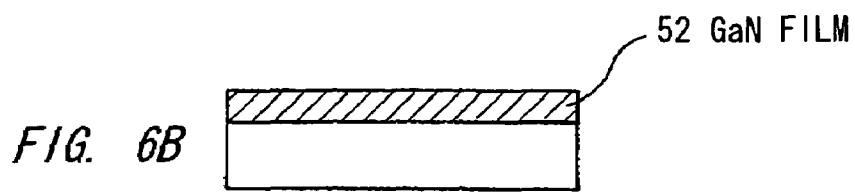
Figure 6C:
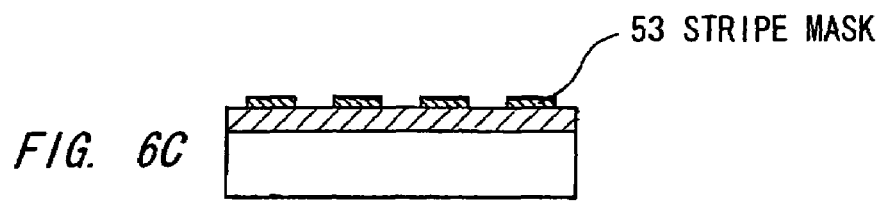
Figure 6D:
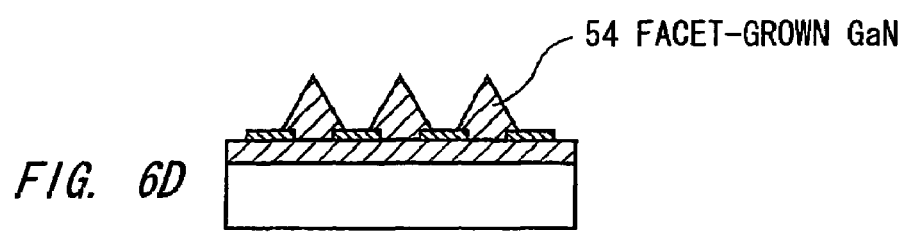

First, a sapphire substrate 51 with a diameter of 2 inches is provided as an underlying substrate (FIG. 6A). Then, a GaN film 52 is formed 300 nm thick on the sapphire substrate 51 by MOVPE (FIG. 6B). Then, a stripe mask 53 of SiO$_2$ is formed thereon by photolithography (FIG. 6C). The mask width and the opening width are 15 micrometers and 10 micrometers, respectively.

Then, it is placed in the HVPE reactor 10 as shown in FIG. 4 and a GaN thick film 55 is grown 500 micrometers thick therein. In this process, the stay time of the HCl gas is adjusted to be 20 sec. by controlling the flow rate of H$_2$ carrier gas based on a calculation in view of the volume of the Ga melt reservoir 6. The H$_2$ partial pressure is 3 kPa, the GaCl partial pressure 0.5 kPa, and the NH$_3$ partial pressure 20 kPa.

$SiH_2Cl_2$ is introduced through the doping tube 5 to adjust the final Si concentration to $5\times10^{18}$ cm$^{-3}$ to secure a sufficient conductivity.

Figure 6E:
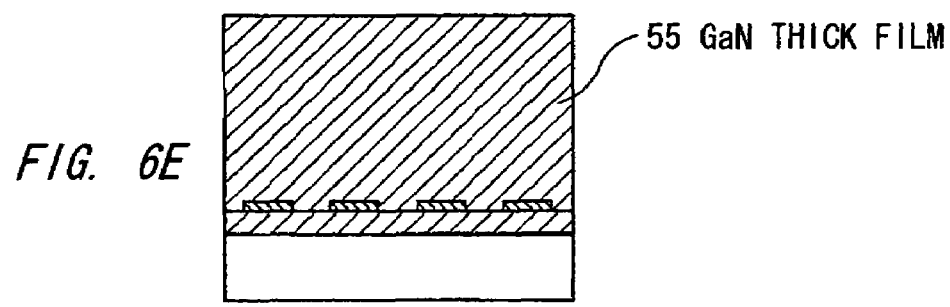

The crystal growth starts from the opening of the stripe mask 53, a facet-grown GaN 54 is then laterally grown (FIG. 6D), and a GaN thick film 55 is obtained with a flat surface (FIG. 6E). As the result of observing the section of a crystal grown under the same conditions by a fluorescence microscope, the facet-grown GaN 54 has a thickness of about 200 micrometers. Thus, the rate of the thickness of the facet-grown GaN 54 in the entire thickness of the GaN layer is about 40%.

Figure 6F:
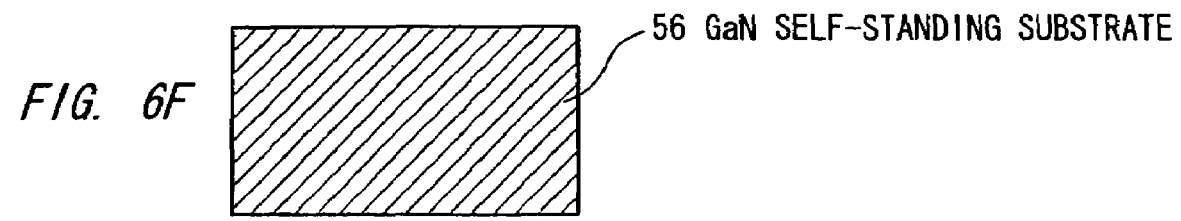

After the growth, the GaN thick film is separated from the sapphire substrate 51 by laser separation, whereby the GaN self-standing substrate 56 with a diameter of 2 inches is obtained (FIG. 6F).

The dislocation density of the obtained GaN self-standing substrate measured by the cathode luminescence method is a relatively good value, $8\times10^6$ cm$^{-2}$. The electrical resistivity thereof is a sufficiently low value, $4\times10^{-3}$ ohm·cm. However, by SIMS analysis, O is detected as high as $1\times10^{18}$ cm$^{-2}$ and Fe is detected about $3\times10^{-17}$ cm$^{-2}$. The optical absorption coefficient to light with a wavelength of 380 nm or more measured by transmission and reflection measurements is as high as 50 cm$^{-2}$.

Experiments

The GaN self-standing substrates obtained in Example 2 and Comparative example are used to fabricate LED's with a same structure.

Both of them have a good drive voltage of about 3.8 V in 20 mA current flow. However, in comparison of the emission output, it is found that the LED fabricated on the GaN self-standing substrate obtained in Example 2 is about 30% greater than that in Comparative example. This is assumed because the GaN self-standing substrate in Example 2 has a transparency higher than that in Comparative example and, therefore, light-emitted from the active layer can be efficiently extracted from the LED.

Other Applications and Modifications

Although in the above embodiments the invention is applied to the method of making the Si-doped GaN self-standing substrate, the invention can be also applied to the method of making a ternary single crystal self-standing substrate such as AlGaN and InGaN and to the method of making a p-type GaN self-standing substrate doped with Mg etc.

Further, the invention can be applied not only to the manufacture of a self-standing substrate but also to the manufacture of a nitride-based semiconductor substrate with a heterosubstrate such as a sapphire substrate.

Although in the above embodiments the invention is applied to the growth process by HVPE, the invention can be also applied to various growth methods such as MOVPE, MBE, flux method using Na etc.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A nitride-based semiconductor substrate, comprising:
   a diameter of 25 mm or more;
   a thickness of 250 micrometers or more;
   an optical absorption coefficient of less than 7 cm$^{-1}$ to light with a predetermined wavelength that is equal to or greater than 380 nm, and
   an electrical resistivity of 0.02 Ωcm or less.

2. The nitride-based semiconductor substrate according to claim 1, further comprising:
   a dislocation density of $1\times10^7$ cm$^{-2}$ or less.

3. The nitride-based semiconductor substrate according to claim 1, further comprising:
   an impurity concentration of $1\times10^{17}$ cm$^{-3}$ or less in relation to any of As, O, Cl, P, Na, K, Li, Ca, Sn, Ti, Fe, Cr and Ni.

4. The nitride-based semiconductor substrate according to claim 1, wherein the electrical resistivity does not fall below 0.001 Ωcm.

5. The nitride-based semiconductor substrate according to claim 1, further comprising:
   a carrier concentration having a range from $1\times10^{17}$ cm$^{-3}$ to $1\times10^{19}$ cm$^{-3}$.

6. The nitride-based semiconductor substrate according to claim 1, further comprising:
   an oxygen impurity concentration having a range from $10^{16}$ cm$^{-3}$ to $10^{18}$ cm$^{-3}$.

7. The nitride-based semiconductor substrate according to claim 1, further comprising:
   an iron impurity concentration having a range from $10^{14}$ cm$^{-3}$ to $10^{17}$ cm$^{-3}$.

8. The nitride-based semiconductor substrate according to claim 1, further comprising:
   a Ga melt-hydrogen chloride gas reaction lasting for a period equal to or greater than one minute.

* * * * *